United States Patent
Bialke et al.

(10) Patent No.: US 7,763,861 B1
(45) Date of Patent: Jul. 27, 2010

(54) DETERMINING A CHARACTERISTIC OF ATOMIC PARTICLES AFFECTING A PROGRAMMABLE LOGIC DEVICE

(75) Inventors: Nathan J. Bialke, Seattle, WA (US); Austin H. Lesea, Los Gatos, CA (US); Michael A. Margolese, Jerusalem (IL); Raymond J. Matteis, Aptos, CA (US)

(73) Assignee: Xilinx, Inc., San Jose, CA (US)

( * ) Notice: Subject to any disclaimer, the term of this patent is extended or adjusted under 35 U.S.C. 154(b) by 492 days.

(21) Appl. No.: 11/975,972

(22) Filed: Oct. 23, 2007

(51) Int. Cl.
*G01T 3/00* (2006.01)
(52) U.S. Cl. .................. 250/391; 250/390.08
(58) Field of Classification Search ............ 250/390.08, 250/391, 392, 393; 365/154, 106
See application file for complete search history.

(56) References Cited

U.S. PATENT DOCUMENTS

| | | | | |
|---|---|---|---|---|
| 3,519,822 A * | 7/1970 | Sleege | .................. | 250/392 |
| 3,715,608 A * | 2/1973 | Glorioso | ................ | 327/509 |
| 3,769,693 A * | 11/1973 | Cates et al. | .............. | 438/17 |
| 5,291,293 A * | 3/1994 | Kapan | ................. | 348/246 |
| 5,436,659 A * | 7/1995 | Vincent | ................ | 348/246 |
| 6,075,261 A * | 6/2000 | Hossain et al. | .......... | 257/252 |
| 6,617,596 B1 * | 9/2003 | Korenev | .............. | 250/492.3 |
| 6,741,754 B2 * | 5/2004 | Hamilton, Jr. | ............ | 382/275 |
| 7,244,952 B2 * | 7/2007 | Mous | ................. | 250/492.21 |
| 7,645,993 B2 * | 1/2010 | Gazda et al. | ............ | 250/370.05 |
| 7,684,232 B1 * | 3/2010 | Lesea | ................ | 365/154 |
| 2003/0094571 A1 * | 5/2003 | Lykken et al. | ............ | 250/304 |
| 2004/0233701 A1 * | 11/2004 | Turner | .................. | 365/154 |
| 2005/0012045 A1 * | 1/2005 | Fifield et al. | .......... | 250/370.02 |
| 2005/0139777 A1 * | 6/2005 | Rostaing et al. | ............ | 250/394 |
| 2007/0215814 A1 * | 9/2007 | Kitchen | .............. | 250/397 |
| 2008/0120525 A1 * | 5/2008 | Agarwal | .............. | 714/731 |
| 2009/0063078 A1 * | 3/2009 | Chandler et al. | .............. | 702/82 |

OTHER PUBLICATIONS

Lesea, Austin et al. "The Rosetta Experiment: Atmospheric Soft Error Rate Testing in Differing Technology FPGAs", IEEE Transactions on Device and Materials Reliability, vol. 5, No. 3, Sep. 2005, pp. 317-328.

Fabula, Joseph J., et al. "The NSEU Response of Static Latch Based FPGAs", presented at the Military and Aerospace Programmable Logic Devices (MAPLD) Conference Sep. 2003, pp. 1-6 (thumbnails).

* cited by examiner

*Primary Examiner*—David P Porta
*Assistant Examiner*—Djura Malevic
(74) *Attorney, Agent, or Firm*—LeRoy D. Maunu

(57) ABSTRACT

Methods and systems are provided for determining a characteristic of an atomic particle affecting a programmable logic device (PLD). The PLD is configured to generate a value at one or more outputs. A source generates a packet of atomic particles. The departure from the source is indicated for the packet of the atomic particles. The PLD is impacted with the packet of the atomic particles. A change is detected in the value of one or more outputs of the PLD. The change in the value of the output or outputs is a result of the impact of the PLD by one of the atomic particles from the packet. A time interval is determined between the departure of the packet of the atomic particles from the source and the change in the value of the output or outputs.

20 Claims, 6 Drawing Sheets

DETERMINING A CHARACTERISTIC OF ATOMIC PARTICLES AFFECTING A PROGRAMMABLE LOGIC DEVICE

FIELD OF THE INVENTION

The present invention generally relates to radiation-induced soft errors in integrated circuits.

BACKGROUND

Cosmic radiation includes high-energy atomic particles. Collisions between particles of cosmic radiation and atoms in the Earth's atmosphere may create a cascading chain of secondary atomic particles. Additional atomic particles may be generated by collisions in the environment of an integrated circuit, such as the packaging of an integrated circuit.

The secondary particles may include a trail of charged particles within an integrated circuit. The cumulative electric charge of the trail of charged particles may be injected into a node of an integrated circuit. Enough electrical charge may be delivered to the node to change the electrical value of the node. For example, enough charge may be delivered to a storage node of a memory cell to change a binary value that is stored in the memory cell.

Typically, cosmic radiation does not cause permanent damage to an integrated circuit. An error in operation of an integrated circuit from cosmic radiation is often denoted a soft error because the integrated circuit may resume normal operation after a reset of the integrated circuit. However, cosmic radiation may cause lasting corruption of data processed by an integrated circuit.

The effects of cosmic radiation generally increase with altitude above sea level. Thus, the effects of cosmic radiation are of special concern for integrated circuits in aerospace applications.

The design of an integrated circuit may include assessing the vulnerability of the integrated circuit to cosmic radiation. If the targeted reliability of an integrated circuit is not achieved, the design of the integrated circuit may need to be modified to increase the tolerance for cosmic radiation.

Because a particular integrated circuit may operate for many years without any detectable effects from cosmic radiation, measuring the sensitivity of an integrated circuit to cosmic radiation may be time consuming and difficult. Artificial sources of high-energy atomic particles may be used to reduce the time required to affect the operation of an integrated circuit. However, it may also be time consuming and difficult to predict the sensitivity of an integrated circuit to cosmic radiation using measurements obtained from artificial sources of high-energy atomic particles.

The present invention may address one or more of the above issues.

SUMMARY

Various embodiments of the invention provide a method for determining a characteristic of an atomic particle affecting a programmable logic device (PLD). The PLD is configured to generate a value at one or more outputs. A source generates a packet of atomic particles. The departure from the source is indicated for the packet of the atomic particles. The PLD is impacted with the packet of the atomic particles. A change is detected in the value of one or more outputs of the PLD. The change in the value of the output or outputs is a result of the impact of the PLD by one of the atomic particles from the packet. A time interval is determined between the departure of the packet of the atomic particles from the source and the change in the value of the output or outputs.

Various other embodiments of the invention provide a system for determining a characteristic of an atomic particle. The system includes a source of a packet of atomic particles, a programmable logic device (PLD), and an analyzer. The source provides an indication of a departure of the packet of the atomic particles. The PLD is positioned at a distance from the source. The PLD is configured to generate a value for one or more outputs of the PLD. A change in the value of the output or outputs is caused by one of the atomic particles from the packet. The analyzer determines a time interval for the atomic particle to traverse the distance, in response to the indication of the departure of the packet of the atomic particles from the source and the change in the value of the output or outputs of the PLD.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

Figure 1:
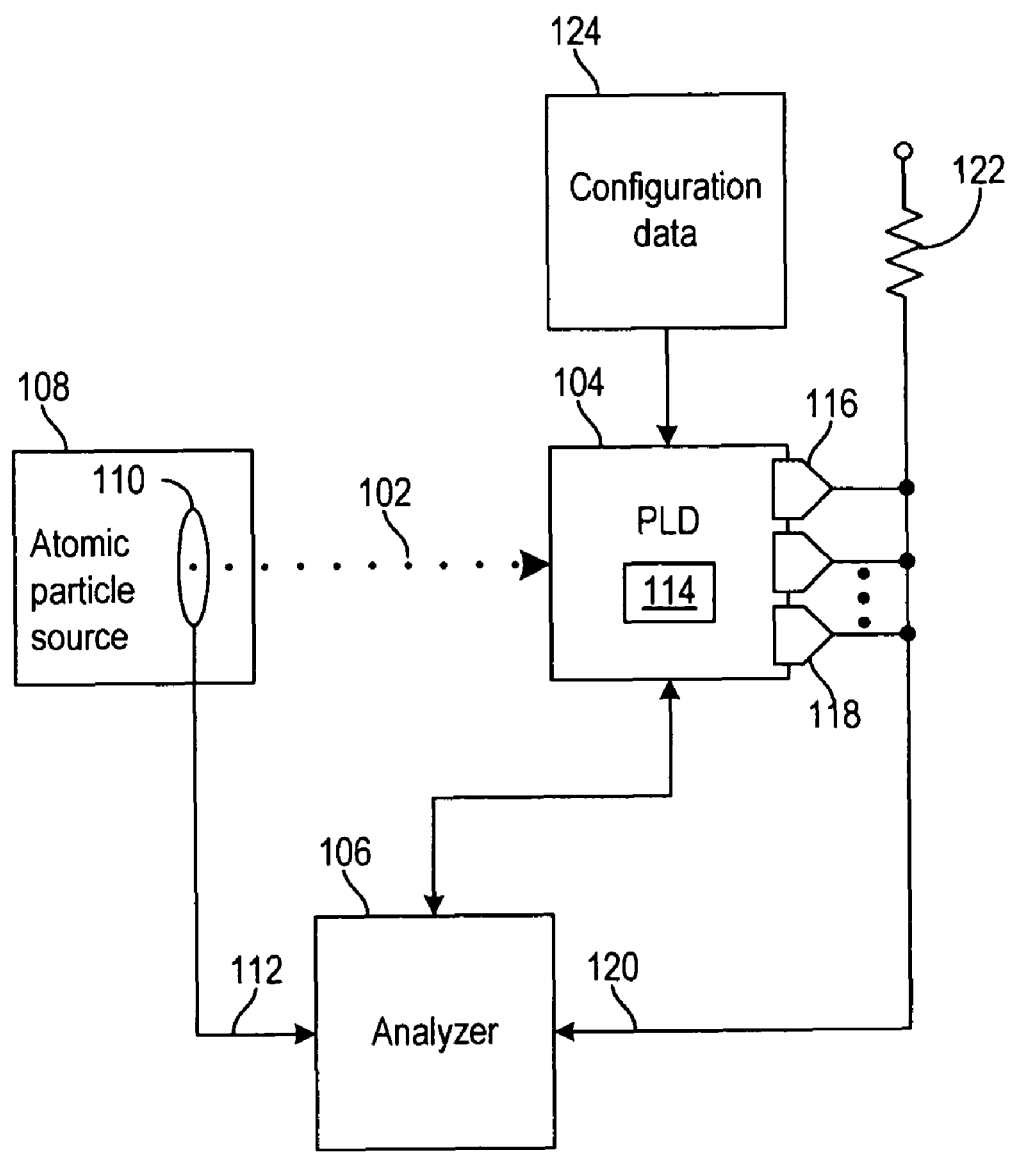
FIG. 1 is block diagram of a system for determining a characteristic of an atomic particle that affects a programmable logic device in accordance with various embodiments of the invention.

FIG. 1 is a block diagram of a system for determining a characteristic of an atomic particle 102 that affects a programmable logic device (PLD) 104 in accordance with various embodiments of the invention. An analyzer 106 may determine a characteristic of an atomic particle 102 or atomic particles that affect PLD 104.

A source 108 may generate atomic particles including atomic particle 102. In one embodiment, a pulse of hydrogen ions is accelerated to high energy and then directed to impact a target 110 of relatively heavy atoms. Neutrons and other atomic particles may be freed from a nucleus of a relatively heavy atom in target 110 following an impact by the nuclear proton of a hydrogen ion. This process of nuclear spallation may generate dozens of neutrons and other atomic particles from each collision between a high-energy proton and a nucleus in target 110. As the atomic particles leave the source 108, strong electric and/or magnetic fields may deflect the charged particles away from PLD 104 to create a packet of uncharged neutrons with a range of kinetic energies. As the packet of neutrons travels towards PLD 104, the neutrons become segregated, with the higher energy neutrons arriving first at PLD 104 and the lower energy neutrons arriving later at PLD 104. Atomic particle 102 may be one of these neutrons with a specific kinetic energy.

The source of hydrogen ions may be a repeatedly pulsed source, such that when each pulse of hydrogen ions strikes target 110, a packet of neutrons is created. The electric charge delivered to target 110 by a pulse of hydrogen ions may also create an electrical pulse delivered on line 112 to analyzer 106. Each electrical pulse on line 112 may indicate the departure of a packet of neutrons from source 108. A particular electrical pulse on line 112 may indicate the departure of the packet including neutron particle 102 from source 108.

It will be appreciated that for a repeatedly pulsed source 108, the time interval between pulses may be arranged to be greater than the lowest energy neutron that could affect PLD 104. Thus, the lowest energy neutron that could affect PLD 104 should arrive at PLD 104 before the next packet of neutrons is generated at pulsed source 108.

In other embodiments of the invention, a geiger-mueller tube, a photomultiplier, a semiconductor imaging array, a transistor array, or another particle detector may detect the high-energy protons incident to target 110 to generate the indication on line 112 of the departure of atomic particle 102 from source 108.

When atomic particle 102 impacts PLD 104, a stream of charged particles may be generated within PLD 104. A portion of the stream of charged particles may be injected in a storage node of a configuration memory cell 114. Enough charge may be injected into the configuration memory cell 114 to change the value stored at the storage node. The programmed function of PLD 104 may be changed by the changed value of configuration memory cell 114. The change in the programmed function of PLD 104 may cause a change in the value of, for example, output 116 of PLD 104. Analyzer 106 may detect the change on line 120 of the value of output 116 of PLD 104. Analyzer 106 may determine a time interval between the pulse on line 112 indicating the departure of atomic particle 102 from source 108 and the change in the output 116 of PLD 104 caused by atomic particle 102 changing a value stored in configuration memory cell 114 upon impacting PLD 104.

In one embodiment of the invention, multiple outputs 116 through 118 may be configured to generate a high impedance output with an open driver, such as an open source driver or an open collector driver. Line 120 may be pulled up to a high level by resistance 122 in a wired-OR arrangement. If one or more of outputs 116 through 118 changes because configuration memory of PLD 104 is modified by an impact from an atomic particle, the open driver may pull line 120 to a low level. Analyzer 106 may detect the change of line 120 from a high level to a low level.

The analyzer 106 may determine a characteristic of the atomic particle 102 that is the time interval between the atomic particle 102 departing the source 108 and the atomic particle affecting PLD 104. Analyzer 106 may use this time interval to determine other characteristics of the atomic particle 102, such as the time interval for the atomic particle 102 to travel the distance between the source 108 and the PLD 104, a velocity of the atomic particle 102, and/or an energy of the atomic particle 102.

In response to the change of value on line 120, the analyzer 106 may prepare the PLD 104 to measure characteristics of another atomic particle. In one embodiment, the analyzer 106 may send a reset signal to PLD 104 and PLD 104 may reload configuration data 124 to restore the configuration of PLD 104. The restored configuration of PLD 104 may change line 120 back to an uncorrupted state. Analyzer 106 may measure characteristics of the next atomic particle that affects outputs 116 through 118 of PLD 104 by changing a value of configuration memory cell 114 or another memory cell of the configuration memory of PLD 104.

In another embodiment of the invention, analyzer 106 may read the contents of configuration memory back from PLD 104 after detecting a change on line 120. Analyzer 106 may compare the current contents of configuration memory with the expected contents of configuration memory to identify the configuration memory cell 114 that was altered by atomic particle 102. The analyzer 106 may provide special handling when more than one configuration memory cell is altered, which may indicate that multiple atomic particles affected PLD 104. For example, the analyzer 106 may discard the measured characteristics when more than one configuration memory cell is altered. Alternatively, because some alterations of configuration memory do not affect the outputs 116 through 118 of the PLD 104, the analyzer 106 may discard the measured characteristics when more than one of the altered configuration memory cells could affect the outputs 116 through 118 of the PLD 104.

After reading back the configuration memory of the PLD 104, the analyzer 106 may directly reconfigure the portion of configuration memory affected by the atomic particle 102. Alternatively, the analyzer 106 may reset the PLD 104 to reload the configuration memory from configuration data 124. It will be appreciated that analyzer 106 may periodically check and/or restore the contents of the configuration memory of PLD 104 without first detecting a change on line 120.

Figure 2:
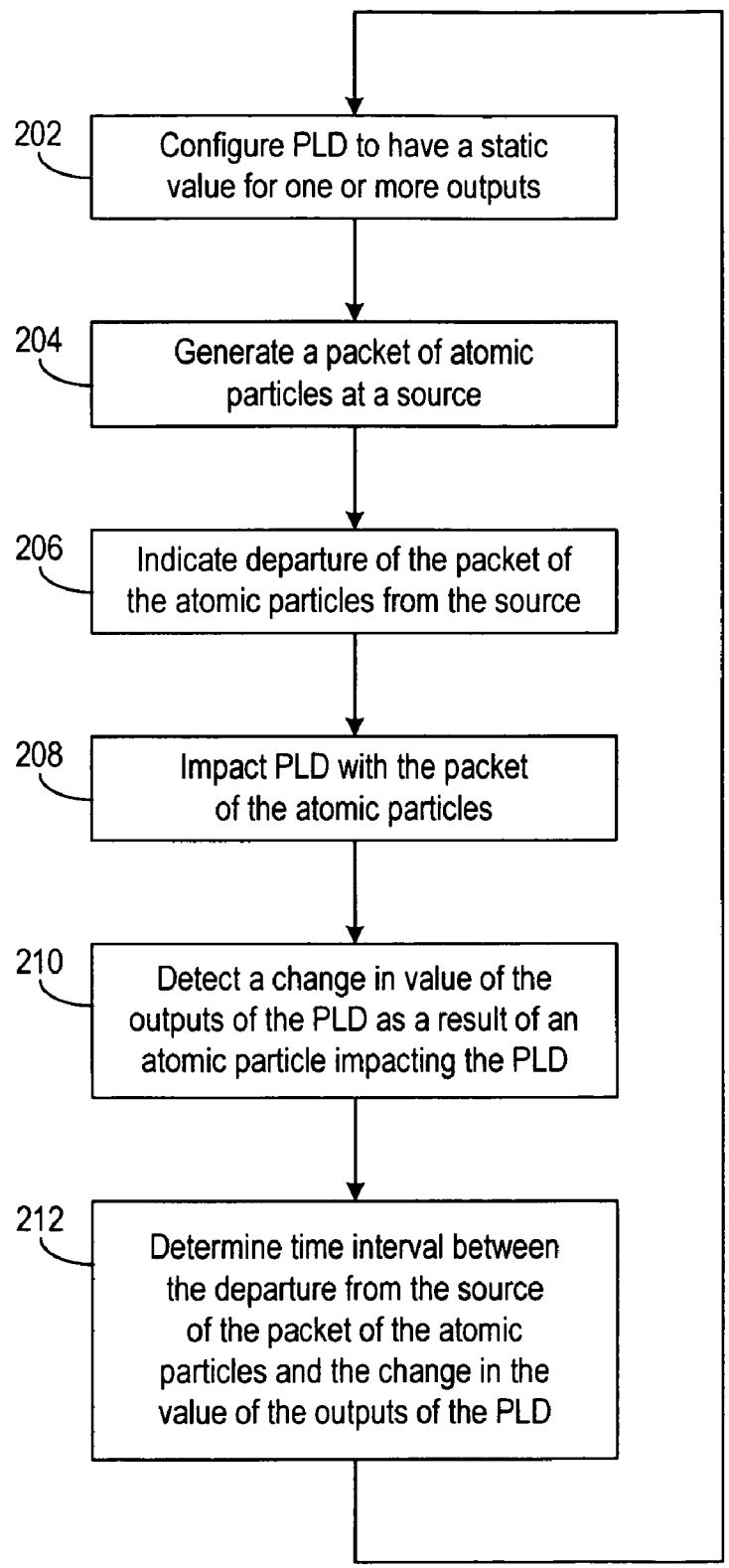
FIG. 2 is flow diagram of a process for determining a characteristic of an atomic particle that affects a programmable logic device in accordance with various embodiments of the invention.

FIG. 2 is flow diagram of a process for determining a characteristic of an atomic particle that affects a programmable logic device in accordance with various embodiments of the invention. The characteristics of the atomic particle may be a time interval for the atomic particle to travel through a distance, a velocity of the atomic particle, and/or an energy of the atomic particle.

At step 202, the PLD is configured to have nominally static values for one or more outputs. The outputs may be tied together to a wire-OR signal, for example, such that the wired-OR signal may be changed as a consequence of a change of any one of the outputs from the nominally static value. Another embodiment utilizes a wired-AND signal. In other embodiments, other combinational logic functions are utilized, such as wired NAND and/or NOR functions.

At step 204, a source generates a packet of atomic particles, and the departure from the source of the packet of atomic particles is indicated at step 206. At step 208, the packet of atomic particles impact a PLD and cause a change in the nominally static value of an output of the PLD. An atomic particle from the packet may corrupt the value of a cell of configuration memory, and the corruption of the cell of configuration memory may change the nominally static value of an output of the PLD. At step 210, the changed value of the outputs of the PLD is detected.

At step 212, a time interval is determined between the departure of the packet of atomic particles from the source and the change in the nominally static value of the outputs of the PLD. This time interval may be used, for example, to determine the kinetic energy of the atomic particle affecting the PLD. The process may repeat by returning to step 202.

Figure 3:
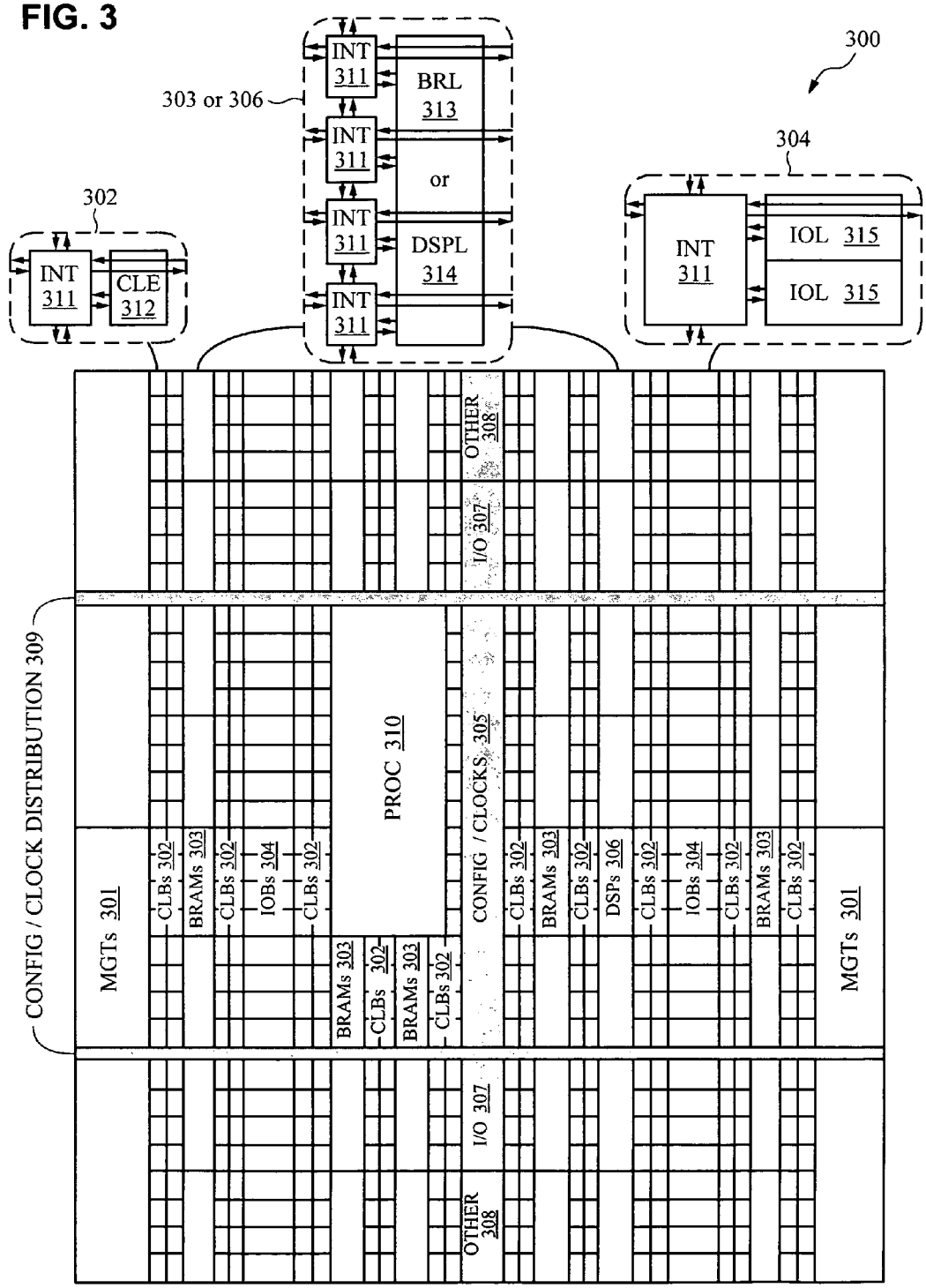
FIG. 3 is a block diagram of a programmable logic device that may be used to determine a characteristic of an atomic particle in accordance with various embodiments of the invention.

FIG. 3 is a block diagram of a programmable logic device that may be used to determine a characteristic of an atomic particle in accordance with various embodiments of the invention. The characteristic of the atomic particle may be determined after the atomic particle affects the configuration memory of the PLD.

PLDs, such as advanced Field Programmable Gate Arrays (FPGAs), can include several different types of programmable logic blocks in the array. For example, FIG. 3 illustrates an FPGA architecture 300 that includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315 are manufactured using metal layered above the various illustrated logic blocks, and typically are not confined to the area of the input/output logic element 315.

In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic.

Figure 4:
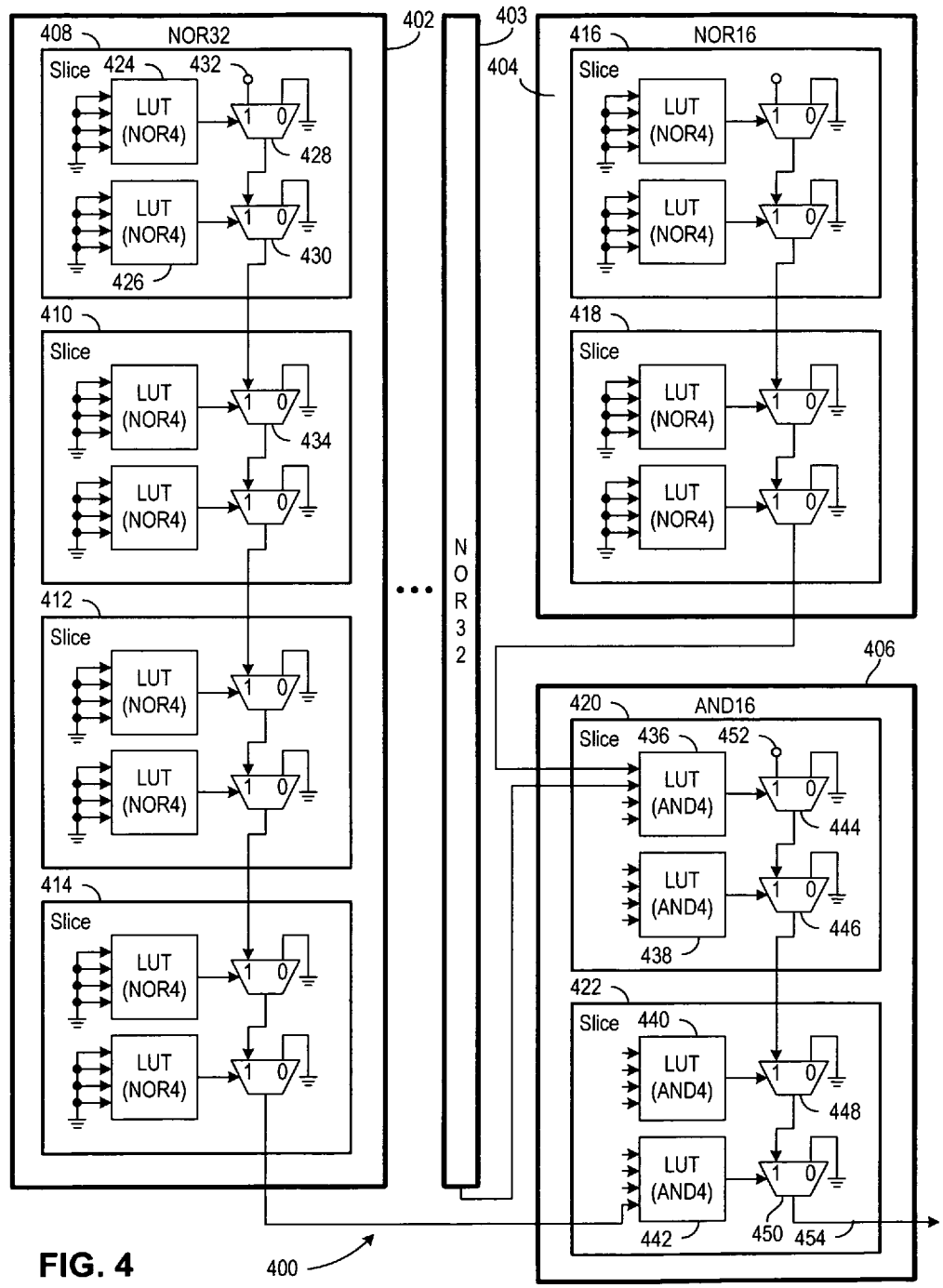
FIG. 4 is a block diagram of a combinational logic function implemented in a programmable logic device for determining a characteristic of an atomic particle in accordance with one or more embodiments of the invention.

FIG. 4 is a block diagram of an exemplary combinational logic function 400 implemented in a programmable logic device for determining a characteristic of an atomic particle in accordance with one or more embodiments of the invention. The combinational logic function 400 generates a nominally static output value that is dependent on the value of a large number of cells of configuration memory. If certain cells of configuration memory change value because of an impact from an atomic particle, then the value output by the combinational logic function 400 also changes value.

The combinational logic function 400 has two levels of logic, with the first level including fifteen 32-input NOR functions 402 through 403 and one 16-input NOR function 404, and the second level including a 16-input AND function 406. Each input of the NOR functions 402, 403, and 404 is tied to a static value of zero. The outputs of the fifteen NOR functions 402 through 403 and the NOR function 404 are coupled to respective inputs of the 16-input AND function 406. Overall, the two levels of the combinational logic function 400 form a 496-input NOR function with every input tied to a static value of zero.

In certain PLDs, such as the FPGA of FIG. 3, the CLBs, such as CLBs 302 of FIG. 3, may include a number of slices programmable to implement a variety of functions. Slices 408 through 422 of a PLD may be configured to implement combinational logic function 400.

Slice 408 may include two look-up tables (LUTs) 424 and 426 and a carry chain including multiplexers 428 and 430. Each LUT 424 and 426 may have four inputs that are each configured to input a static value of zero, and the table values of LUTs 424 and 426 may be configured to implement a 4-input NOR function. Thus, LUT 424 normally outputs a selector value of one to multiplexer 428 and LUT 426 also normally outputs a selector value of one to multiplexer 430. Multiplexer 428 may be configured to tie a static one-value 432 to the input selected by the selector value of one coming from LUT 424 and a static value of zero to the other input. Thus, multiplexer 428 is configured to normally propagate the static one-value 432 to multiplexer 430, and multiplexer 430 is configured to further propagate this value to multiplexer 434 of slice 410.

Slices 410, 412, and 414 are similarly configured to slice 408 with the exceptions that the carry chains of slices 410, 412, and 414 are configured to form a cascaded carry chain that normally propagates the static one-value 432 from slice 424 to an input of AND function 406. Slices 416 and 418 of 16-input NOR function 404 are configured similarly to respective slices 408 and 414 to form a shorter cascaded carry chain.

Each input of the LUTs 436, 438, 440, and 442 of slices 420 and 422 of AND function 406 are configured to receive an output of one of the NOR functions 402 through 403 and 404. LUTs 436, 438, 440, and 442 are configured to implement an AND function that normally outputs a value of one to multiplexers 444, 446, 448, and 450. Multiplexers 444, 446, 448, and 450 are configured to form a carry chain that normally propagates the static one-value 452 to the output on line 454 of the combinational logic function 400.

While the NOR function 400 normally outputs a static value of one at output 454, the corruption of configuration memory from the impact of an atomic particle may cause the output 454 to change. For example, LUT 424 includes sixteen configuration memory cells of which one is selected by the static input values to LUT 424. If this selected configuration memory cell is corrupted by an atomic particle, LUT 424 would no longer output the normal value of one, and would instead output a value of zero. Multiplexer 428 would subsequently no longer propagate the static one-value 432 to multiplexer 430. Thus, the carry chain starting at multiplexer 428 would switch the value provided to AND function 406, and the AND function 406 would switch the value output on line 454.

More configuration memory cells (not shown) control the selection of the inputs for the LUTs, such as LUTs 424 and 436, and the configuration of the carry chains, including multiplexers 428 and 450 for example. Corruption of the values of some of these configuration memory cells might change the value output on line 454. However, corruption of certain configuration memory cells will not affect the value output on line 454. For example, the value of only one of the sixteen table values of LUT 424 is normally output by LUT 424, so the output on line 454 would not change after a corruption limited to the configuration memory cell for one of the other fifteen table values of LUT 424.

Figure 5:
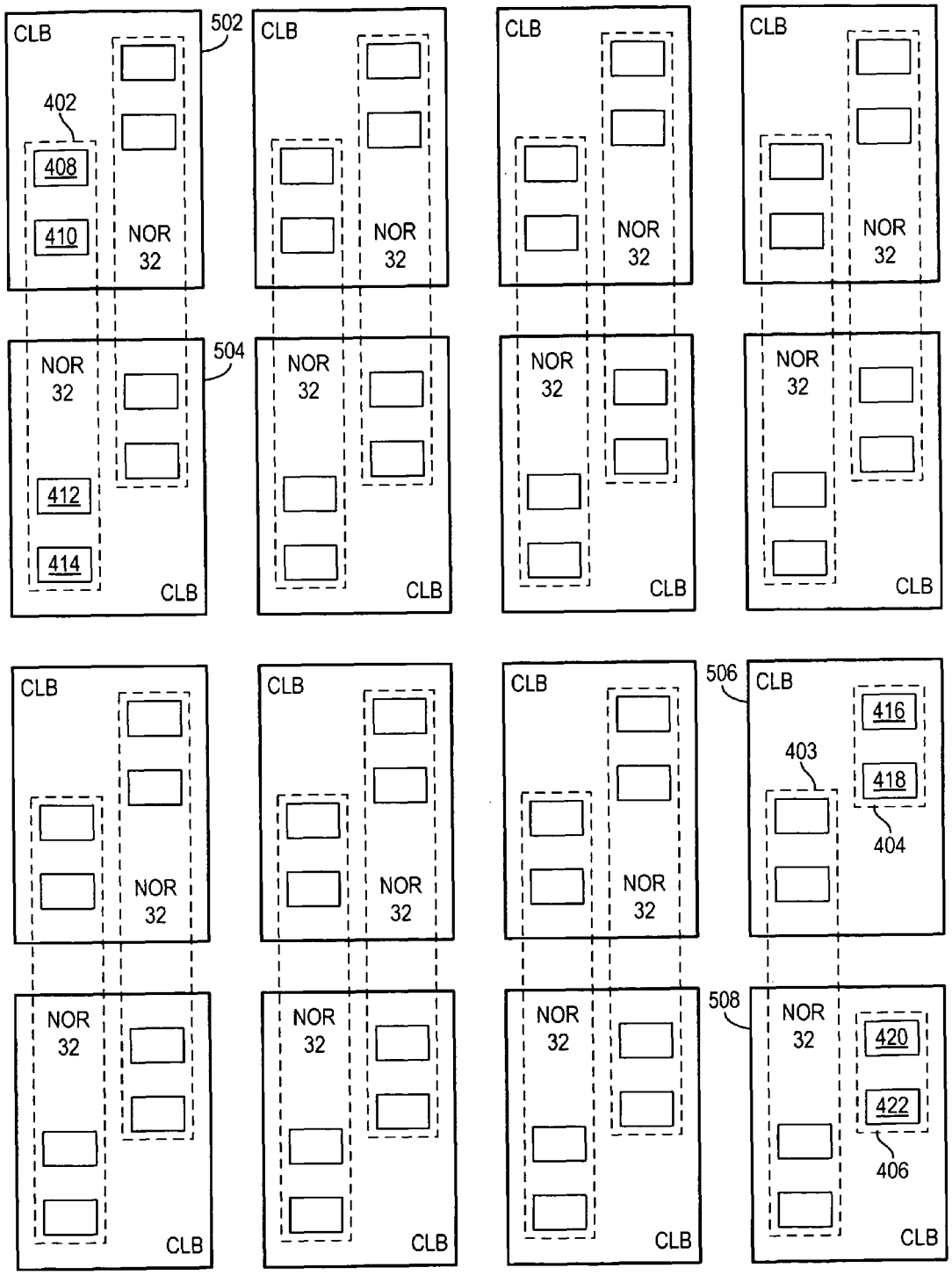
FIG. 5 is a block diagram of a physical placement of a combinational logic function in the programmable logic resources of a programmable logic device in accordance with one or more embodiments of the invention.

FIG. 5 is a block diagram of a physical placement of a combinational logic function in the programmable logic resources of a programmable logic device in accordance with one or more embodiments of the invention. The combinational logic function 400 from FIG. 4 may be implemented in a four by four array of CLBs that includes CLBs 502, 504, 506, and 508.

The 32-input NOR function 402 may be implemented in slices 408, 410, 412, and 414 of CLBs 502 and 504. The 32-input NOR function 403 may be similarly implemented in four slices of CLBs 506 and 508. The remaining thirteen 32-input NOR functions may be implemented in half of the slices of a pair of CLBs. The 16-input NOR function 404 may be implemented in slices 416 and 418 of CLB 506. Finally, the 16-input AND function 406 may be implemented in slices 420 and 422 of CLB 508.

A PLD may include many CLBs arranged in one or more arrays of CLBs. Each four by four array of CLBs within a PLD may be configured to implement a copy of the 496-input NOR function. This approach may increase the number of configuration memory cells for which corruption causes a change in an output of the PLD.

Figure 6:
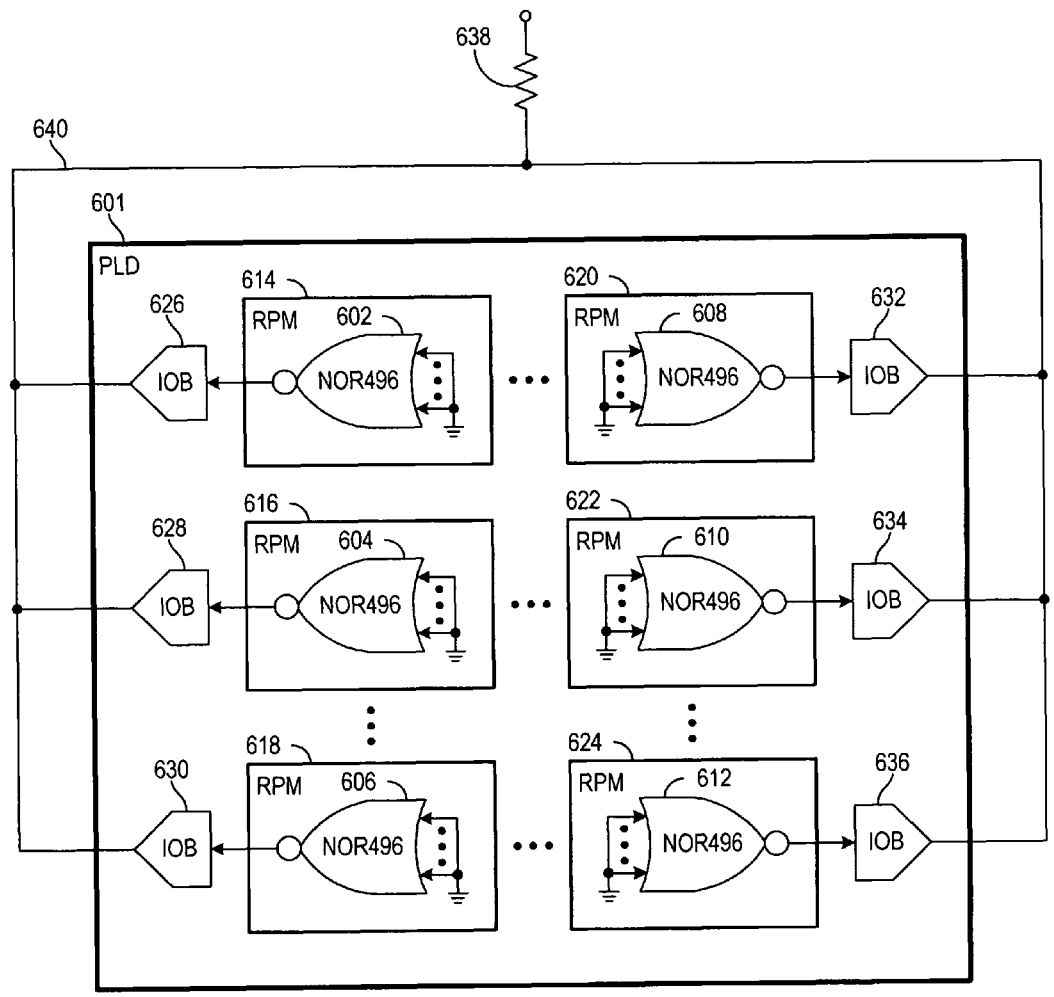
FIG. 6 is a block diagram illustrating a physical placement of combinational logic functions in a programmable logic device in accordance with one or more embodiments of the invention.

FIG. 6 is a block diagram illustrating a physical placement of combinational logic functions in a programmable logic device 601 in accordance with one or more embodiments of the invention. Each 496-input NOR function 602 through 612 may correspond to the combinational logic function of FIG. 4.

In one embodiment, a relationally placed macro is created to map the 496-input NOR function of FIG. 4 to a four by four array of CLBs of the PLD as shown in FIG. 5. Instances 614 through 624 of the relationally placed macro may be placed in all possible four by four arrays of CLBs in the PLD 601. Each instance of the relationally placed macro may include a parameter identifying the four by four array of CLBs. For example, the parameter may specify the location in the PLD 601 of an origin of the four by four array of CLBs. The instances 614 through 624 of the relationally placed macro may also each include a parameter for identifying the respective IOBs 626 through 636 that are tied to the output of the 496-input NOR function.

Using relationally placed macros may allow every CLB in the PLD 601 to used in one of the 496-input NOR functions. In contrast, full utilization of the CLBs of a PLD may be difficult to achieve using place and route tools. Using relationally placed macros may reduce the variations, including timing variations, between the instances of the 496-input NOR functions.

The outputs of IOBs 626 through 636 may be tied together and to resistor 638 in a wired-OR arrangement. The IOBs 626 through 636 may be configured as an open driver, such as an open source driver or an open collector driver. After configuration of PLD 601, each IOB 626 through 636 may normally present a high impedance output that is pulled up to a value of one on line 640 by resistor 638. After a configuration memory cell is corrupted, one of the IOBs 626 through 636 may switch to actively driving a value of zero on line 640. An analyzer (not shown) may detect the change in value of line 640.

As discussed previously, each NOR function 602 through 612 may be implemented in two levels of combinational logic. The wired-OR connections of IOBs 626 through 636 to pull-up resistor 638 may represent a third level of combinational logic. Thus, all of the CLBs of PLD 601 might be used to generate a combinational logic tree that has three levels and culminates in an indicator on line 640 of corruption of the configuration memory of the PLD 601. The small number of levels may reduce the range of delays possible between the corruption of configuration memory and the switching of the indicator on line 640, even though the corruption could occur within either the first level or the second level. While the wired-OR arrangement may result in a slow slew rate because of loading from a large number of IOBs 626 through 636, careful characterization of the response of the actual circuit or simulations of this response may accurately compensate for the slow slew rate.

In one embodiment of the invention, a characteristic of an atomic particle can be determined with sufficient accuracy by compensating only for the slow slew rate of the wired-OR arrangement. In another embodiment of the invention, the identify of the corrupted configuration memory cell is determined (e.g., by reading back the configuration data from the configuration memory and comparing the readback data with the expected data), and the compensation further includes compensation for the propagation delay between the configuration memory cell and an output of the PLD. This delay may depend upon the location of the corrupted configuration memory cell within the first or second level of combinational logic. The delay compensation may use an actual delay measurement or a simulated delay calculation.

The measurements may be used to determine the energy of the atomic particle that corrupted the configuration memory cell. Repeated measurement may be used to determine a spectrum of the energies of the atomic particles that affect the PLD.

The critical charge of a storage cell is the minimum amount of charge that needs to be injected into the storage cell to change the stored value. Simulations of the storage cell and surrounding circuitry may be used to determine the critical charge. The critical charge of a storage cell is dependent on the loading, especially the capacitive loading, of the storage cell. Because the configuration memory cells of a PLD may have various loadings, corruption may occur in configuration memory cells with a variety of critical charges.

When an output change indicates a corruption of a configuration memory cell by an atomic particle, the energy of the atomic particle may be determined and the configuration memory may be read back to determine the configuration memory cell that was corrupted. Through repeated measurements, the susceptibility of the configuration memory to corruption may be determined as a function of both the critical charges of the corrupted configuration memory cells and the energies of the atomic particles. By integrating over the spectrum of energies of cosmic radiation present at a particular altitude, the natural susceptibility to corruption by cosmic radiation may be accurately determined as a function of the critical charge of a configuration memory cell.

The susceptibility to corruption versus critical charge at a particular altitude from an existing PLD may be used to predict the susceptibility of a future PLD. During the design of the future PLD, the susceptibility at a particular altitude may be integrated over the critical charges of all the configuration memory cells in the future PLD. The result may predict the susceptibility of the future PLD to corruption by cosmic radiation at the particular altitude. If the design of the future PLD does not meet a targeted reliability, the design may be modified to improve reliability. For example, extra wiring load may be added to certain configuration memory cells to increase the critical charge for these configuration memory cells. After modification, an updated prediction of the susceptibility may be checked for compliance with the targeted reliability.

It will be appreciated that PLDs having different layouts of CLBs, IOBs, and interconnect circuitry (and the functional equivalents thereof) may also implement the various embodiments of the invention described herein. Those skilled in the art will appreciate that the invention could be implemented in different FPGA architectures, other types of programmable logic devices (PLDs) other than FPGAs, integrated circuits that include programmable logic circuitry and/or adapted to various application requirements, based on both volatile and non-volatile technologies.

The present invention is thought to be applicable to a variety of systems for determining a characteristic of an atomic particle affecting a programmable logic device. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for determining a characteristic of an atomic particle affecting a programmable logic device (PLD), the method comprising:
   configuring the PLD to generate a value for at least one output of the PLD;
   generating a packet of a plurality of atomic particles at a source;
   indicating departure of the packet of the atomic particles from the source;
   impacting the PLD with the packet of the atomic particles;
   detecting a change in the value of the at least one output of the PLD, wherein the change in the value of the at least one output of the PLD is a result of the impacting of the PLD by one of the atomic particles from the packet; and
   determining a time interval between the departure of the packet of the atomic particles from the source and the change in the value of the at least one output of the PLD.

2. The method of claim 1, further comprising determining a characteristic of the atomic particle that is an energy of the atomic particle in response to a characteristic of the atomic particle that is the time interval between the departure of the atomic particle from the source and the change in the value of the at least one output of the PLD.

3. The method of claim 1, wherein the PLD is positioned at a distance from the source, and the determining of the time interval includes determining a time interval for the atomic particle to traverse the distance between the source and the PLD.

4. The method of claim 3, wherein the determining of the time interval includes compensating for a propagation delay between a configuration memory cell of the PLD and the at least one output of the PLD, the configuration memory cell of the PLD storing a value that is changed by the impacting by the atomic particle.

5. The method of claim 4, further comprising ascertaining the configuration memory cell of the PLD that stores the value that is changed by the impacting by the atomic particle.

6. The method of claim 3, further comprising determining an energy of the atomic particle as a function of the time interval for the atomic particle and the distance between the source and the PLD.

7. The method of claim 1, wherein the configuring of the PLD to generate the value for the at least one output of the PLD includes configuring, for each of a plurality of outputs of the PLD, a combinational logic function having a static value coupled to a plurality of inputs of the combinational logic function and a result of the combinational logic function coupled to the output of the PLD.

8. The method of claim 7, wherein the configuring of the combinational logic function for the output of the PLD includes configuring the combinational logic function for the output of the PLD that is a NOR function with the static value of zero coupled to a plurality of inputs of the NOR function.

9. The method of claim 8, wherein the NOR function for the output of the PLD has a first level of a plurality of NOR functions and a second level of an AND function that receives a respective carry-out from the NOR functions of the first level, the NOR and AND functions of the first and second levels each including a plurality of look-up tables and an associated carry chain configured to propagate a respective carry-in with a static value of one to the respective carry-out from the NOR functions and a respective carry-out from the AND function that is coupled to the output of the PLD.

10. The method of claim 7, wherein the configuring of the combinational logic functions for the outputs of the PLD includes placing a physical arrangement of the combinational logic functions on an array of programmable logic resources of the PLD.

11. A system for determining a characteristic of an atomic particle, the system comprising:
    a source of a packet of a plurality of atomic particles, wherein the source provides an indication of a departure of the packet of the atomic particles from the source;
    a programmable logic device (PLD) positioned at a distance from the source of the packet of the atomic particles, the PLD configured to generate a value for at least one output of the PLD, wherein a change in the value of the at least one output is caused by one of the atomic particles from the packet; and
    an analyzer adapted to determine a time interval for the atomic particle to traverse the distance, wherein the analyzer is adapted to determine the time interval in response to the indication of the departure of the packet of the atomic particles from the source and the change in the value of the at least one output of the PLD.

12. The system of claim 11, wherein the atomic particle is a neutron.

13. The system of claim 11, wherein a configuration memory of the PLD is configured to generate the value for the at least one output, the change in the value of the at least one output is a result of a change in a value stored in a cell of the configuration memory, and the change in the value stored in the cell is caused by the atomic particle.

14. The system of claim 11, wherein the analyzer is further adapted, in response to the change in the value of the at least one output, to reconfigure the PLD to generate the value for the at least one output.

15. The system of claim 14, wherein the analyzer is further adapted to reset the PLD in response to the change in the value of the at least one output, and the PLD is adapted to reconfigure the PLD with configuration data in response to the reset.

16. The system of claim 11, wherein the analyzer is further adapted to successively determine a respective time interval to traverse the distance for each of a plurality of atomic particles in response to the indication of the departure from the source of the packet for the atomic particle and the change in the value of the at least one output caused by the atomic particle.

17. The system of claim 16, wherein the analyzer is further adapted to determine an energy spectrum of the atomic particles in response to the respective time interval to traverse the distance for each of the atomic particles.

18. The system of claim 11, further comprising a resistance coupled to each of the at least one output of the PLD.

19. The system of claim 18, wherein the PLD is further configured to generate an open driver at each of the at least one output, and the resistance is coupled to each of the at least one output in a wired-OR arrangement.

20. A system for determining a characteristic of an atomic particle affecting a programmable logic device (PLD), the system comprising:
- means for configuring the PLD to generate a value for at least one output of the PLD;
- means for generating a packet of a plurality of atomic particles at a source;
- means for indicating departure of the packet of the atomic particles from the source;
- means for impacting the PLD with the packet of the atomic particles;
- means for detecting a change in the value of the at least one output of the PLD, wherein the change in the value of the at least one output of the PLD is a result of the impacting of the PLD by one of the atomic particles from the packet; and
- means for determining a time interval between the departure of the packet of the atomic particles from the source and the change in the value of the at least one output of the PLD.

* * * * *